United States Patent [19]

Hashimoto et al.

[11] Patent Number: 5,792,586
[45] Date of Patent: Aug. 11, 1998

[54] POSITIVE RESIST COMPOSITION COMPRISING A NOVOLAC RESIN MADE FROM A CYCLOALKYL SUBSTITUTED PHENOL

[75] Inventors: Kazuhiko Hashimoto, Ibaraki; Haruyoshi Osaki; Yasunori Uetani, both of Toyonaka, all of Japan

[73] Assignee: Sumitomo Chemical Company, Limited, Osaka, Japan

[21] Appl. No.: 335,406

[22] Filed: Nov. 3, 1994

[30] Foreign Application Priority Data

Nov. 8, 1993  [JP]  Japan ................. 5-278225

[51] Int. Cl.$^6$ ................. G03F 7/023; G03F 7/30
[52] U.S. Cl. ................. 430/192; 430/165; 430/193; 430/326
[58] Field of Search ................. 430/165, 192, 430/193, 326

[56] References Cited

U.S. PATENT DOCUMENTS

| | | | |
|---|---|---|---|
| 4,123,279 | 10/1978 | Kobayashi | 430/192 |
| 5,238,771 | 8/1993 | Goto et al. | 430/192 |
| 5,468,590 | 11/1995 | Hashimoto et al. | 430/192 |

FOREIGN PATENT DOCUMENTS

| | | |
|---|---|---|
| 0297825 | 1/1989 | European Pat. Off. |
| 62-260146 | 11/1987 | Japan. |
| 2-84414 | 3/1990 | Japan. |
| 3-274054 | 2/1991 | Japan. |
| 5-181270 | 7/1993 | Japan. |
| 5-188590 | 7/1993 | Japan. |
| 5-222146 | 8/1993 | Japan. |

*Primary Examiner*—John S. Chu
*Attorney, Agent, or Firm*—Birch, Stewart, Kolasch & Birch, LLP

[57] ABSTRACT

The present invention provides a positive photoresist composition comprising a 1,2-naphthoquinonediazide compound and a novolac resin obtained through a condensation reaction between an aldehyde compound and a phenol compound represented by the following general formula (I):

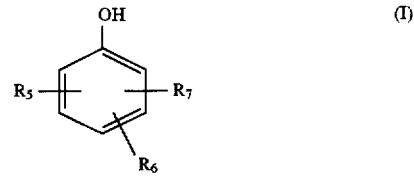

(I)

wherein $R_5$, $R_6$ and $R_7$ each independently represents hydrogen atom, hydroxyl group or alkyl, cycloalkyl, alkoxy or alkenyl group having 6 or less carbon atoms or aryl group, provided that at least one of $R_5$, $R_6$ and $R_7$ represents a cycloalkyl group having 6 or less carbon atoms. The composition of the present invention is excellent in the balance between properties such as sensitivity, resolution, heat resistance, profile, depth of focus, etc. and free from scum.

21 Claims, No Drawings

POSITIVE RESIST COMPOSITION COMPRISING A NOVOLAC RESIN MADE FROM A CYCLOALKYL SUBSTITUTED PHENOL

BACKGROUND OF THE INVENTION

1. Field of the Invention

The present invention relates to a positive resist composition sensitive to radiations such as ultraviolet rays, far ultraviolet rays including excimer laser, etc.

2. Related Art

Recently, with a rise in the integration level of integrated circuits, formation of pattern of sub-micron order is required. As its result, a positive resist composition free from scum (undeveloped residue) and further excellent in properties such as resolution, profile, depth of focus, heat resistance, etc. is demanded. Particularly in the production of 16–64 MDRAMs, it is necessary to resolve a pattern having a line width of 0.5 μm or less with a good profile and a good depth of focus.

Japanese Patent Application KOKAI No. 62-260146 discloses a positive photoresist composition containing a substituted phenol novolac resin which is a condensation product of formaldehyde and a mixed phenol component comprising 90.0–99.5% by weight of a mixture of m-cresol and at least one phenol compound represented by the following formula:

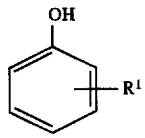

wherein $R^1$ is alkyl, alkenyl or aryl group having 1–6 carbon atoms located in the ortho or para position, and 10.0–0.5% by weight of at least one phenol compound represented by the following formula:

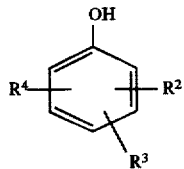

wherein $R^2$ and $R^3$ each independently represents alkyl, alkenyl or aryl group having 1–6 carbon atoms provided that at least one of $R^2$ and $R^3$ is located in the 2- or 4-position and $R^2$ and $R^3$ cannot simultaneously be methyl groups, and $R^4$ represents hydrogen or alkyl, alkenyl or aryl group having 1–6 carbon atoms and a photosensitizer constituted mainly of naphthoquinonediazidesulfonic acid ester, wherein the content of the photosensitizer is 20–60 parts by weight per 100 parts by weight of the substituted phenol novolac resin.

This composition, however, cannot resolve a pattern having a line width of 0.5 μm or less with a broad depth of focus with a good profile.

The present invention provides a positive resist composition excellent in the balance between properties such as sensitivity, resolution, heat resistance, profile, depth of focus and freedom from scum.

SUMMARY OF THE INVENTION

According to the present invention, there is provided a positive resist composition comprising a 1,2-naphthoquinonediazide compound and a novolac resin obtained through a condensation reaction between an aldehyde compound and a phenol compound represented by the following general formula (I):

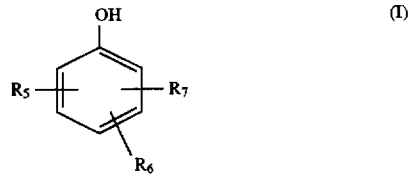

wherein $R_5$ to $R_7$ each independently represents hydrogen atom, hydroxyl group or alkyl, cycloalkyl, alkoxy or alkenyl group having 6 or less carbon atoms or aryl group, provided that at least one of $R_5$ to $R_7$ is cycloalkyl group having 6 or less carbon atoms.

According to the present invention, there is further provided a positive resist composition comprising 1,2-naphthoquinonediazide compound and a novolac resin obtained through a condensation reaction between an aldehyde compound and a phenol compound mixture, said phenol compound mixture being a mixture of a phenol compound represented by the general formula (I) and a phenol compound represented by the following general formula (II):

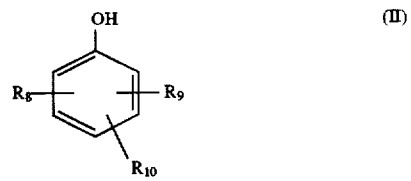

wherein $R_8$, $R_9$ and $R_{10}$ each independently represents hydrogen atom, hydroxyl group or alkyl group having 1–6 carbon atoms.

DETAILED DESCRIPTION OF THE INVENTION

As the phenol compound represented by the general formula (I), preferred are the phenol compounds represented by the following general formula (III):

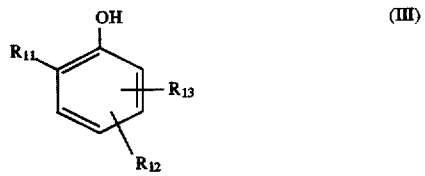

wherein $R_{11}$ represents cycloalkyl group and $R_{12}$ and $R_{13}$ each independently represents hydrogen atom or alkyl group having 1–6 carbon atoms, and further preferred are the phenol compounds represented by the following general formula (IV):

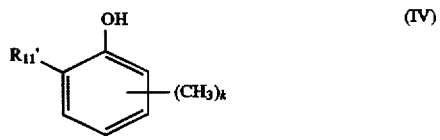

wherein $R_{11}'$ represents cyclopentyl or cyclohexyl group and k represents an integer from 0 to 2. Of these phenol compounds, 2-cyclohexyl-5-methylphenol and 2-cyclohexylphenol are more preferred, and 2-cyclohexyl-5-methylphenol is particularly preferred.

As the phenol compound represented by the general formula (II), preferred are at least one member selected from the phenol compounds represented by the following general formula (V):

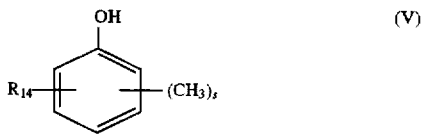

wherein $R_{14}$ represents hydrogen atom, hydroxyl group or alkyl group having 1–6 carbon atoms and s represents an integer from 0 to 3. Of these phenol compounds, particularly preferred are at least one member selected from m-cresol, p-cresol and 2,5-xylenol.

When a phenol compound represented by the general formula (III) is used as the phenol compound represented by the general formula (I), the above-mentioned phenol compound mixture is so formulated that the amount of the phenol compound represented by the general formula (III) is preferably 0.01–0.2 mol and further preferably 0.03–0.15 mol, per mol of the phenol compound represented by the general formula (II).

As the aldehyde compound, at least one member selected from formaldehyde, paraformaldehyde, acetaldehyde, glyoxal, the aromatic aldehydes represented by the following general formula (VI):

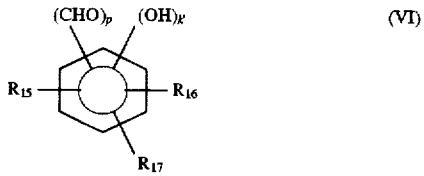

wherein $R_{15}$ to $R_{17}$ each independently represents hydrogen atom or alkyl, cycloalkyl, alkoxy or alkenyl group having 6 or less carbon atoms or aryl group, k' represents an integer not smaller than 0 and p represents a number of 1–3, provided that k' and p satisfy k'+p $\leq$ 3, and the like can be used.

As examples of the aldehyde compound represented by the general formula (VI), benzaldehyde, p-hydroxybenzaldehyde, terephthalaldehyde, salicylaldehyde and the like can be mentioned.

The condensation reaction is carried out in the conventional manner. The reaction temperature is usually 60° to 120° C., and the reaction time is usually 2 to 30 hours. As the catalyst, inorganic acids such as hydrochloric acid, sulfuric acid, phosphoric acid and the like, organic acids such as oxalic acid, acetic acid, p-touenesulfonic acid and the like, and divalent metal salts such as zinc acetate and the like are used. The condensation reaction is carried out in the presence or absence of a reaction solvent.

The novolac resin formed by the condensation reaction is made by the method of fractionation, etc., into a material in which the area ratio of the GPC pattern of a range in that a molecular weight, as converted to polystyrene, is not higher than 900 is preferably 25% or less, and further preferably 20% or less based on the total pattern area, excluding the pattern area of unreacted phenol compounds, as measured by means of UV 254 detector.

The fractionation is carried out by dissolving a novolac resin obtained through the condensation reaction in a good solvent such as alcohols (for example, methanol and ethanol), ketones (for example, acetone, methyl ethyl ketone and methyl isobutyl ketone), ethylene glycol ethers, ether esters (for example, ethyl cellosolve acetate) and tetrahydrofuran, followed by pouring the solution thus obtained into water to form a precipitate or by pouring the solution into a solvent such as pentane, hexane or heptane to separate the mixture into two layers.

As examples of the 1,2-naphthoquinonediazide compound, the compounds obtained by subjecting a phenol compound having two or more hydroxyl groups, preferably three or more hydroxyl groups, and 1,2-naphthoquinonediazide-4- or -5-sulfonic acid chloride to a condensation reaction in the presence of a weak alkali such as triethylamine, sodium carbonate and the like can be referred to.

As said compound having two or more hydroxyl groups, for example, the compounds mentioned in Page 3 of Japanese Patent Application KOKAI No. 2-103543 as a general formula, the compounds mentioned in Japanese Patent Application KOKAI No. 2-32352 as the general formula (I) or (II), the compounds mentioned in Page 4 of Japanese Patent Application KOKAI No. 4-50851 as formulas, oxyflavans including the compounds mentioned in Japanese Patent Application KOKAI No. 4-295472 as the general formula (I), etc. can be referred to. These 1,2-naphthoquinonediazide compounds are used either independently or in the form of a mixture of two or more. Preferably, the 1,2-naphthoquinonediazide compounds are used in an amount of 10–50% by weight based on the total solid component in the positive resist composition.

The positive resist composition of the present invention may contain another ingredient in addition to the novolac resin and the 1,2-naphthoquinonediazide compound. Examples of the another ingredient include an alkali-soluble compound of which molecular weight is lower than 900 or a cresol-formaldehyde novolac resin of which weight average molecular weight is lower than 900.

As said alkali-soluble compound of which molecular weight is lower than 900, compounds having at least two phenolic hydroxyl groups are preferred. More preferable alkali-soluble compounds are the compounds mentioned in Japanese Patent Application KOKAI No. 2-275955 as the general formula (I), the compounds mentioned in Japanese Patent Application KOKAI No. 4-50851 as the general formula (I), the compounds mentioned in Japanese Patent Application KOKAI No. 3-179353 as the general formula (I), and the like. As examples of said cresol-formaldehyde novolac resin of which weight average molecular weight is lower than 900, m-cresol-formaldehyde novolac resin and the like can be referred to.

The alkali-soluble compound of which molecular weight is lower than 900 or the cresol-formaldehyde novolac resin of which weight average molecular weight is lower than 900 is used preferably in an amount of 3–40% by weight based on the total solid component in the positive resist composition.

To the positive resist composition of the present invention, additives conventionally used in this field of the art such as dye, adhesion-improver and the like may be added, if desired.

As the solvent used for preparation of a positive resist solution, solvents vaporizable at an appropriate rate and capable of giving a uniform and smooth coating film after evaporation are preferred. Examples of such solvent include glycol ether esters such as ethyl cellosolve acetate, propylene glycol monomethyl ether acetate and the like, the solvents mentioned in Japanese Patent Application KOKAI No. 2-220056, esters such as ethyl pyruvate, n-amyl acetate, ethyl lactate and the like, and ketones such as 2-heptanone, γ-butyrolactone and the like. These solvents are used either independently or in the form of a mixture of two or more.

The positive resist composition of the present invention is excellent in the balance between properties such as sensitivity, resolution, profile, heat resistance, depth of focus, etc. and freedom from scum.

Next, the present invention is concretely explained with reference to examples. The invention is by no means limited by these examples. In the examples, parts are by weight.

SYNTHESIS EXAMPLE 1

A three-necked flask having a capacity of 1,000 ml was charged with 40.16 g of 2-cyclohexyl-5-methylphenol, 114.9 g of m-cresol, 114.9 g of p-cresol, 235.6 g of methyl isobutyl ketone, 12.0 g of oxalic acid dihydrate and 72.3 g of 90% acetic acid. While stirring the content of the flask, 123.8 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 5,986.

SYNTHESIS EXAMPLE 2

A three-necked flask having a capacity of 1,000 ml was charged with 40.16 g of 2-cyclohexyl-5-methylphenol, 195.3 g of m-cresol, 46.0 g of p-cresol, 235.6 g of methyl isobutyl ketone, 12.0 g of oxalic acid dihydrate and 72.3 g of 90% acetic acid. While stirring the content of the flask, 143.8 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 5,924.

SYNTHESIS EXAMPLE 3

A three-necked flask having a capacity of 1,000 ml was charged with 22.4 g of 2-cyclohexyl-5-methylphenol, 128.4 g of m-cresol, 128.4 g of p-cresol, 251.4 g of methyl isobutyl ketone, 12.8 g of oxalic acid dihydrate and 80.8 g of 90% acetic acid. While stirring the content of the flask, 132.9 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 6,262.

SYNTHESIS EXAMPLE 4

A three-necked flask having a capacity of 1,000 ml was charged with 22.4 g of 2-cyclohexyl-5-methylphenol, 205.5 g of m-cresol, 51.4 g of p-cresol, 251.4 g of methyl isobutyl ketone, 12.8 g of oxalic acid dihydrate and 80.8 g of 90% acetic acid. While stirring the content of the flask, 153.7 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 6,159.

SYNTHESIS EXAMPLE 5

A three-necked flask having a capacity of 1,000 ml was charged with 22.4 g of 2-cyclohexyl-5-methylphenol, 128.4 g of m-cresol, 128.4 g of p-cresol, 58.0 g of 2,5-xylenol, 301.6 g of methyl isobutyl ketone, 15.3 g of oxalic acid dihydrate and 96.9 g of 90% acetic acid. While stirring the content of the flask, 165.4 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 5,928.

SYNTHESIS EXAMPLE 6

A three-necked flask having a capacity of 1,000 ml was charged with 22.4 g of 2-cyclohexyl-5-methylphenol, 205.5 g of m-cresol, 51.4 g of p-cresol, 58.0 g of 2,5-xylenol, 301.6 g of methyl isobutyl ketone, 15.3 g of oxalic acid dihydrate and 96.9 g of 90% acetic acid. While stirring the content of the flask, 192.2 g of 37.0% aqueous solution of formaldehyde was dropwise added thereto over a period of 60 minutes, and then the resulting mixture was reacted at 95° C. for 15 hours. The reaction mixture was washed with water and dehydrated to obtain a solution of novolac resin in methyl isobutyl ketone. As measured by GPC, the product had a polystyrene-converted weight average molecular weight of 6,052.

SYNTHESIS EXAMPLE 7

A 3-liters flask was charged with 300 g of the solution of novolac resin in methyl isobutyl ketone obtained in Synthesis Example 1 in which the content of novolac resin was 40% by weight, to which were further added 180 g of methyl isobutyl ketone and 319 g of n-heptane. The content of the flask was stirred at 60° C. for 30 minutes and then left to stand until it separated into two layers and the lower layer was drained from the bottom. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 10,658, and the area ratio of the range in which the molecular weight as converted to polystyrene was 900 or less to the total pattern area was 16.4%.

SYNTHESIS EXAMPLE 8

A 5-liters flask was charged with 300 g of the solution of novolac resin in methyl isobutyl ketone obtained in Synthesis Example 2 in which the content of novolac resin was 40% by weight, to which were further added 221.7 g of methyl isobutyl ketone and 356.3 g of n-heptane. The content of the flask was stirred at 60° C. for 30 minutes and then left to stand until it separated into two layers. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 9,031, and the area ratio of the range in which the molecular weight as converted to polystyrene was 900 or less to the total pattern area was 15.1%.

SYNTHESIS EXAMPLE 9

A 3-liters flask was charged with 300 g of the solution of novolac resin in methyl isobutyl ketone obtained in Synthesis Example 3 in which the content of novolac resin was 40% by weight, to which were further added 200 g of methyl isobutyl ketone and 337 g of n-heptane. The content of the flask was stirred at 60° C. for 30 minutes and then left to stand until it separated into two layers. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 10,059, and the area ratio of the range in which the molecular weight as converted to polystyrene was 900 or less to the total pattern area was 15.4%.

SYNTHESIS EXAMPLE 10

A 3-liters flask was charged with 300 g of the solution of novolac resin in methyl isobutyl ketone obtained in Synthesis Example 4 in which the content of novolac resin was 40% by weight, to which were further added 222 g of methyl isobutyl ketone and 342 g of n-heptane. The content of the flask was stirred at 60° C. for 30 minutes and then left to stand until it separated into two layers. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 10,011, and the area ratio of the range in which the molecular weight as converted to polystyrene was 900 or less to the total pattern area was 16.2%.

SYNTHESIS EXAMPLE 11

A 3-liters flask was charged with 300 g of the solution of novolac resin in methyl isobutyl ketone obtained in Synthesis Example 5 in which the content of novolac resin was 40% by weight, to which were further added 222 g of methyl isobutyl ketone and 342 g of n-heptane. The content of the flask was stirred at 60° C. for 30 minutes and then left to stand until it separated into two layers. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 9,921, and the area ratio of the range in which the molecular weight as converted to polystyrene was 900 or less to the total pattern area was 14.6%.

SYNTHESIS EXAMPLE 12

A 3-liters flask was charged with 300 g of the solution of novolac resin in methyl isobutyl ketone obtained in Synthesis Example 6 in which the content of novolac resin was 40% by weight, to which were further added 222 g of methyl isobutyl ketone and 342 g of n-heptane. The content of the flask was stirred at 60° C. for 30 minutes and then left to stand until it separated into two layers. To the lower layer thus obtained was added 400 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 9,711, and the area ratio of the range in which the molecular weight as converted to polystyrene was 900 or less to the total pattern area was 15.1%.

SYNTHESIS EXAMPLE 13

A three-necked flask having a capacity of 1,000 ml was charged with 128.4 g of m-cresol, 128.4 g of p-cresol, 264.6 g of methyl isobutyl ketone, 13.4 g of oxalic acid dihydrate and 63.8 g of 90% acetic acid. While stirring the content of the flask, 153 g of 37.0% aqueous solution of formaldehyde was dropwise added thereto over a period of 60 minutes at 80° C., and then the resulting mixture was reacted at 100° C. for 15 hours. The reaction mixture was washed with water and dehydrated to obtain a solution of novolac resin in methyl isobutyl ketone. As measured by GPC, the product had a polystyrene-converted weight average molecular weight of 4,520.

SYNTHESIS EXAMPLE 14

A 3-liters flask was charged with 200 g of the solution of novolac resin in methyl isobutyl ketone obtained in Synthesis Example 13 in which the content of novolac resin was 40% by weight, to which were further added 410 g of methyl isobutyl ketone and 488 g of n-heptane. The content of the flask was stirred at 60° C. for 30 minutes and then left to stand until it separated into two layers. To the lower layer thus obtained was added 180 g of 2-heptanone, after which the methyl isobutyl ketone and n-heptane were removed by means of an evaporator to obtain a solution of novolac resin in 2-heptanone. As measured by GPC, the product thus obtained had a polystyrene-converted weight average molecular weight of 8,900, and the area ratio of the range in which the molecular weight as converted to polystyrene was 900 or less to the total pattern area was 16.2%.

EXAMPLES 1–4 AND COMPARATIVE EXAMPLES 5–6

According to the formulation shown in the following table, a novolac resin (in the table, simply referred to as "resin"), a 1,2-naphthoquinonediazide compound (in the table, simply referred to as "photosensitizer") and an alkali-soluble compound or a cresol-formaldehyde novolac resin (in the table, simply referred to as "additive") were mixed and dissolved in 50 parts of 2-heptanone.

The solution thus obtained was filtered through a Teflon filter having a pore size of 0.2 μm to prepare a resist solution. A silicon wafer washed in the conventional manner was coated with the resist solution up to a thickness of 1.1 μm by means of spin coater and baked on hot plate at 90° C. for one minute. Subsequently, the wafer was exposed to light by the use of a reduction projection exposing machine having an exposure wavelength of 365 nm (i-line) (NSR1755i7A, NA=0.5, manufactured by Nikon Corp.) in Examples 1, 2, 3 and 5 and by the use of a reduction projection exposing machine having an exposure wavelength of 436 nm (g-line) (NSR1755g7A, NA=0.54, manufactured by Nikon Corp.) in Examples 4 and 6, while stepwise changing the amount of exposure.

Subsequently, the wafer was baked on a hot plate at 110° C. for one minute. Then, it was developed for one minute with SOPD (alkaline developing solution; product of Sumitomo Chemical Co., Ltd.) to obtain a positive pattern. A resolution was evaluated by measuring, with a scanning electron microscope, the dimension of the minimum line-and-space pattern which could be resolved without film thickness decrease at an exposure amount giving 1:1 line-and-space of a 0.4 μm line-and-space pattern (in Examples 1, 2, 3 and 5) or of a 0.8 μm line-and-space pattern (in Examples 4 and 6) (effective sensitivity).

Profile and scum were evaluated by observing, with a scanning electron microscope, the cross-sectional shape of a 0.45 μm line-and-space pattern (in Examples 1, 2, 3 and 5) or of a 0.6 μm line-and-space pattern (in Examples 4 and 6), both at an effective sensitivity.

The depth of focus was determined by observing, with a scanning electron microscope, a degree of focus shifting at which a 0.4 μm line-and-space pattern (in Examples 1, 2, 3 and 5) or a 0.8 μm line-and-space pattern (in Examples 4 and 6) could be resolved at an effective sensitivity without film thickness decrease.

Heat resistance was evaluated by observing the extent of sagging of resist pattern after being heated on a hot plate at 124° C. for 5 minutes. The result was expressed in terms of five grades system, provided that 5 means that heat resistance is best and 1 means that heat resistance is not good.

TABLE 1

| | Formulation of resist | | | Properties of resist | | | | | |
|---|---|---|---|---|---|---|---|---|---|
| Example No. | Resin (Synthesis Example No.) | Additive | Photo-sensitizer | Effective sensitivity | Resolution | Profile | Depth of focus | Scum | Heat resistance |
| 1 | (7) 5 parts (8) 5 parts | B 3.7 parts | C 3.75 parts D 0.50 part | 360 msec | 0.35 μm | | 1.35 μm | Not found | 4 |
| 2 | (9) 2 parts (10) 2 parts | B 3.7 parts | C 3.75 parts D 0.50 part | 400 msec | 0.35 μm | | 1.35 μm | Not found | 4 |
| 3 | (11) 3.4 parts (12) 6.6 parts | B 3.7 parts | C 3.75 parts D 0.50 part | 380 msec | 0.35 μm | | 1.35 μm | Not found | 4 |
| 4 | (7) 1.9 parts (8) 9.1 parts | B 1.65 parts G 1.65 parts | E 3.9 parts F 1.7 parts | 240 msec | 0.475 μm | | 3.25 μm | Not found | 4 |
| 5 | (14) 10 parts | B 3.7 parts | C 3.75 parts D 0.50 part | 390 msec | 0.375 μm | | 0.9 μm | Found | 4 |
| 6 | (14) 11 parts | B 1.65 parts G 1.65 parts | E 3.9 parts F 1.7 parts | 220 msec | 0.50 μm | | 2.75 μm | Found | 4 |

In the table, the additive B is an alkali-soluble compound represented by the following formula:

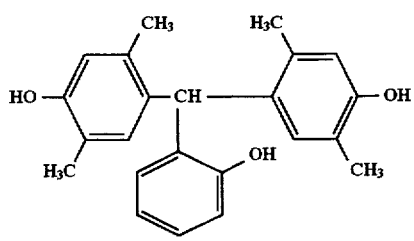

B of which molecular weight is lower than 900.

In the table, photosensitizers C to F are each a condensate formed between 1,2-naphthoquinonediazide-5-sulfonic acid chloride and the following phenol compounds C', D', E' and F', respectively:

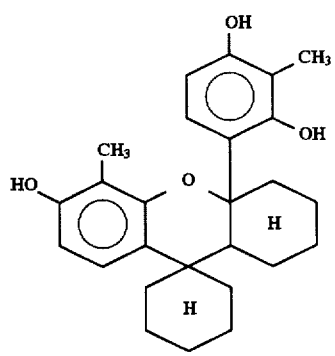

C':

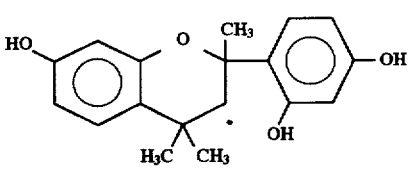

D':

E': 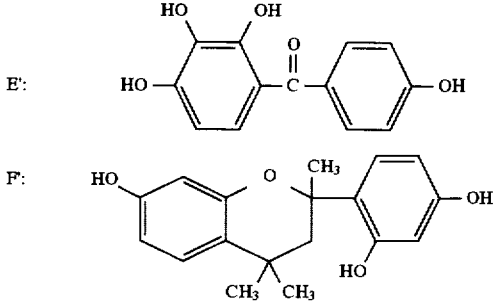

F':

In the condensation reaction, 1,2-naphthoquinonediazide-5-sulfonic acid chloride was used in an amount of 2 mol, 2.8 mol, 2.3 mol and 2 mol, respectively, per mol of each phenol compound.

The additive G is cresol-formaldehyde novolac resin of which weight average molecular weight is 350.

What is claimed is:

1. A positive resist composition comprising a 1,2-naphthoquinonediazide compound and a novolac resin having an area ratio of 25% or less of molecular weights 900 or lower, as converted to polystyrene, as compared to a total GPC pattern area, excluding the pattern area of unreacted phenol compounds obtained through a condensation reaction between an aldehyde compound and a phenol compound represented by the following general formula (I):

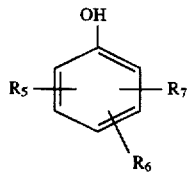 (I)

wherein $R_5$, $R_6$ and $R_7$ each represents a hydrogen atom, hydroxyl group, alkyl, alkoxy, alkenyl group having 1–6 carbon atoms, cycloalkyl group having 3–6 carbon atoms, or an aryl group, provided that at least one of $R_5$, $R_6$ and $R_7$ represents a cycloalkyl group having 3–6 carbon atoms.

2. A positive resist composition comprising a 1,2-naphthoquinonediazide compound and a novolac resin having an area ratio of 25% or less of molecular weights 900 or lower, as converted to polystyrene, as compared to a total GPC pattern area, excluding the pattern area of unreacted phenol compounds obtained through a condensation reaction between an aldehyde compound and a phenol compound mixture, said phenol compound mixture being a mixture of a phenol compound represented by the general formula (I) of claim 1 and a phenol compound represented by the following general formula (II):

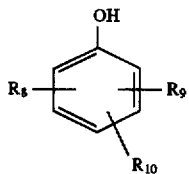 (II)

wherein $R_8$, $R_9$ and $R_{10}$ each independently represents a hydrogen atom, hydroxyl group or alkyl group having 1–6 carbon atoms.

3. A positive resist composition according to claim 2, wherein the phenol compound represented by the general formula (I) is a phenol compound represented by the following general formula (III):

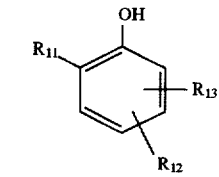 (III)

wherein $R_{11}$ represents a cycloalkyl group and $R_{12}$ and $R_{13}$ each independently represents a hydrogen atom or alkyl group having 1–6 carbon atoms.

4. A positive resist composition according to claim 2 or 3, wherein the phenol compound represented by the general formula (II) is at least one member selected from the group consisting of m-cresol, p-cresol and 2,5-xylenol.

5. A positive resist composition according to claim 3, wherein the phenol compound represented by the general formula (I) is 2-cyclohexyl-5-methylphenol.

6. A positive resist composition according to claim 3, which further contains an alkali-soluble compound of which the molecular weight is lower than 900 or a cresol-formaldehyde novolac resin of which the weight average molecular weight is lower than 900.

7. A positive resist composition according to claim 6, wherein said alkali-soluble compound of which the molecular weight is lower than 900 is a compound having at least two phenolic hydroxyl groups.

8. A positive resist composition according to claim 6, wherein said cresol-formaldehyde novolac resin of which the weight average molecular weight is lower than 900 is a m-cresol-formaldehyde novolac resin.

9. A positive resist composition according to claim 1, wherein the preparation process for said novolac resin includes a fractionation step.

10. A positive resist composition according to claim 1, wherein said area ratio of molecular weights 900 or lower is 20% or less.

11. A positive resist composition according to claim 1, wherein the weight average molecular weight of said novolac resin is greater than about 9,000.

12. A process for producing an integrated circuit comprising coating a positive resist composition comprising a 1,2-naphthoquinonediazide compound and a novolac resin having an area ratio of 25% or less of molecular weights 900 or lower, as converted to polystyrene, as compared to a total GPC pattern area, excluding the pattern area of unreacted phenol compounds obtained through a condensation reaction between an aldehyde compound and a phenol compound represented by the following general formula (I):

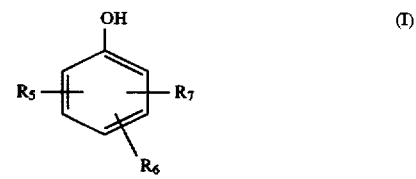 (I)

wherein $R_5$, $R_6$ and $R_7$ each represents a hydrogen atom, hydroxyl group or alkyl, cycloalkyl, alkoxy or alkenyl group having 6 or less carbon atoms or aryl group, provided that at least one of $R_5$, $R_6$ and $R_7$ represents a cycloalkyl group having 3–6 carbon atoms, onto a surface of a semiconductor substrate, subjecting the coated composition to exposure to light through a mask on which a circuit pattern is described; and developing the exposed, coated composition.

13. A process for producing an integrated circuit comprising coating a naphthoquinonediazide compound and a novolac resin having an area ratio of 25% or less of molecular weights 900 or lower, as converted to polystyrene, as compared to a total GPC pattern area, excluding the pattern area of unreacted phenol compounds obtained through a condensation reaction between an aldehyde compound and a phenol compound mixture, said phenol compound mixture being a mixture of a phenol compounds represented by the general formula (I) of claim 12 and a phenol compound represented by the following general formula (II):

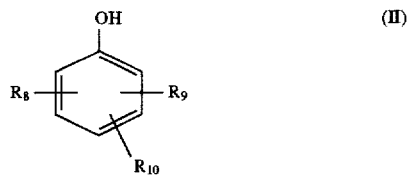

wherein $R_8$, $R_9$ and $R_{10}$ each independently represents hydrogen atom, hydroxyl group or alkyl group having 1–6 carbon atoms, onto a surface of a semiconductor substrate,
    subjecting the coated composition to exposure to light through a mask on which a circuit pattern is described; and
    developing the exposed, coated composition.

14. The process according to claim 13, wherein the phenol compound represented by the general formula (I) is a phenol compound represented by the following general formula (III):

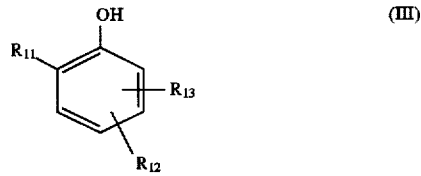

wherein $R_{11}$ represents cycloalkyl group and $R_{12}$ and $R_{13}$ each independently represents hydrogen atom or alkyl group having 1–6 carbon atoms.

15. The process according to claim 13, wherein the phenol compound represented by the general formula (II) is at least one member selected from the group consisting of m-cresol, p-cresol and 2,5-xylenol.

16. The process according to claim 14, wherein the phenol compound represented by the general formula (II) is at least one member selected from the group consisting of m-cresol, p-cresol and 2,5-xylenol.

17. The process according to claim 14, wherein the phenol compound represented by the general formula (I) is 2-cyclohexyl-5-methylphenol.

18. The process according to claim 14, wherein, in said novolac resin, the area ratio in GPC pattern of a range in that molecular weight as converted to polystyrene is 900 or lower to the total GPC pattern area excluding the pattern area of unreacted phenol compounds is 25% or less.

19. The process according to claim 14, which further contains an alkali-soluble compound of which molecular weight is lower than 900 or a cresol-formaldehyde novolac resin of which weight average molecular weight is lower than 900.

20. The process according to claim 19, wherein said alkali-soluble compound of which molecular weight is lower than 900 is a compound having at least two phenolic hydroxyl groups.

21. The process according to claim 19, wherein said cresol-formaldehyde novolac resin of which weight average molecular weight is lower than 900 is a m-cresol-formaldehyde novolac resin.

* * * * *